(12) United States Patent
Takahashi

(10) Patent No.: US 8,656,230 B2
(45) Date of Patent: Feb. 18, 2014

(54) DRIVING METHOD OF ELECTRONIC DEVICE

(75) Inventor: Yasuyuki Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 299 days.

(21) Appl. No.: 13/167,126

(22) Filed: Jun. 23, 2011

(65) Prior Publication Data

US 2011/0320891 A1     Dec. 29, 2011

(30) Foreign Application Priority Data

Jun. 25, 2010     (JP) .................................. 2010-145130

(51) Int. Cl.
*G11C 29/00*     (2006.01)
*H02J 7/00*     (2006.01)
*G06F 1/00*     (2006.01)

(52) U.S. Cl.
USPC ........................... 714/718; 713/300; 320/124

(58) Field of Classification Search
USPC ......... 714/718, 724, 740, 745, 799, 300, 320, 714/340; 307/11, 25, 38; 320/103–104, 320/124, 127–130, 133, 135, 137, 155
See application file for complete search history.

(56) References Cited

U.S. PATENT DOCUMENTS

| | | | |
|---|---|---|---|
| 4,560,916 A | 12/1985 | Yoshiyuki et al. | |
| 5,524,044 A | 6/1996 | Takeda | |
| 5,654,621 A | 8/1997 | Seelig | |
| 6,026,921 A | 2/2000 | Aoyama et al. | |
| 6,837,438 B1 | 1/2005 | Takasugi et al. | |
| 7,674,650 B2 | 3/2010 | Akimoto et al. | |
| 7,737,658 B2 | 6/2010 | Sennami et al. | |
| 7,885,117 B2 | 2/2011 | Shin et al. | |
| 8,132,026 B2 * | 3/2012 | Koyama ........................ | 713/300 |
| 2002/0157881 A1 | 10/2002 | Bakholdin et al. | |
| 2004/0145348 A1* | 7/2004 | Bucur et al. ................... | 320/128 |
| 2004/0207362 A1* | 10/2004 | Kanouda et al. ............... | 320/104 |
| 2005/0254183 A1 | 11/2005 | Ishida et al. | |
| 2007/0216348 A1 | 9/2007 | Shionoiri et al. | |
| 2008/0210762 A1 | 9/2008 | Osada et al. | |
| 2010/0072285 A1 | 3/2010 | Nishijima | |
| 2010/0289331 A1 | 11/2010 | Shionoiri et al. | |

FOREIGN PATENT DOCUMENTS

| | | |
|---|---|---|
| JP | 2004-229425 | 8/2004 |
| JP | 2005-210843 | 8/2005 |
| JP | 2006-180073 | 7/2006 |
| JP | 2009-259385 | 11/2009 |

* cited by examiner

*Primary Examiner* — Christine Tu
(74) *Attorney, Agent, or Firm* — Husch Blackwell LLP

(57) ABSTRACT

A method for driving an electronic device stably is provided. The electronic device includes a power supply circuit to which power is fed by power sequentially supplied from a contactless power feeding device, and a plurality of loads to which power is sequentially supplied from the power supply circuit. Further, a method for driving an electronic device stably is provided. The electronic device includes a power supply circuit to which power is fed by power supplied from a contactless power feeding device, and one or more loads to which the power supply circuit repeatedly supplies power. The power supply potential $V_{dd}$ is restored to more than or equal to 90% of the initial potential $V_{dd0}$ within an interval in which the power supply circuit is not connected to a load; then, the next load may be connected to the power supply circuit, and may be driven.

12 Claims, 8 Drawing Sheets

DRIVING METHOD OF ELECTRONIC DEVICE

BACKGROUND OF THE INVENTION

1. Field of the Invention

The present invention relates to a method for driving an electronic device including a power supply circuit which converts supplied contactlessly or wirelessly energy into power and supplies the power to another circuit.

2. Description of the Related Art

A contactless power feeding technique by which power is contactlessly supplied to a power supply circuit of an electronic device is well known. In comparison with a conventional technique for feeding power using a contact, the contactless power feeding technique is convenient because the positional relationship between the electronic device and a power feeding device is not severely limited during power feeding. Specifically, a method for transmitting power from a contactless power feeding device with a radio wave, magnetic force, or the like by utilizing electromagnetic induction, a radio wave, or resonance of an electric field or a magnetic field is known.

Replacement of a primary battery or the like is not necessary for an electronic device which is operated by power fed according to the contactless power feeding technique. In particular, the electronic device without even a secondary battery or the like can be referred to as a passive electronic device, realizing reduction in weight, size, and cost. An example of such an electronic device is a passive RFID tag.

Note that the amount of power fed by the contactless power feeding technique varies depending on the distance between a contactless power feeding device and an electronic device supplied with power. For example, when the distance between a reader/writer which is a contactless power feeding device and a passive RFID tag is extremely short without intention, the passive RFID tag is supplied with extremely high power and an element in the passive RFID tag might be broken. A known technique for preventing such a problem is to provide a protective circuit (Patent Document 1).

Further, for a passive RFID tag, various kinds of load circuit can be provided other than a power supply circuit; for example, a one time programmable ROM (OTP ROM) can be provided. An OTP ROM is a memory circuit including a plurality of non-volatile memory elements to which data can be written only once. Because an OTP ROM does not need power for holding data, an OTP ROM is preferable for a passive electronic device.

As a non-volatile memory element which can be used for an OTP ROM, an element including a fuse and an element including a floating gate are given, for example. Note that as an example of a method for writing data to an OTP ROM, a method for precluding malfunction by preventing electrons from being captured in an interface of an insulating film to improve reliability of reading data is disclosed (Patent Document 2).

REFERENCES

[Patent Document 1] Japanese Published Patent Application No. 2006-180073
[Patent Document 2] Japanese Published Patent Application No. 2009-259385

SUMMARY OF THE INVENTION

When a power supply circuit is connected to a load, a power supply potential $V_{dd}$ output from the power supply circuit is decreased from an initial potential $V_{dd0}$ over time, and converges at a power supply potential $V_{dd1}$. The heavier the load becomes with respect to the capacity of the power supply circuit (or the smaller the capacity of the power supply circuit becomes with respect to the load), the larger the difference between the initial potential $V_{dd0}$ and the power supply potential $V_{dd1}$ ($|V_{dd0}-V_{dd1}|$) becomes. When the load is disconnected from the power supply circuit, the power supply potential $V_{dd}$ is restored and approaches the initial potential $V_{dd0}$. Accordingly, when the power supply circuit is intermittently connected to the load, the power supply potential $V_{dd}$ varies between the initial potential $V_{dd0}$ and the power supply potential $V_{dd1}$.

There arises a problem of a substantial reduction in the capacity of the power supply circuit in the electronic device, to which power is fed by the contactless power feeding technique, in the case where there is limitation on the intensity of a radio wave or the like, which is utilized for transmitting power used for the contactless power feeding technique in order to prevent electromagnetic interference (e.g., malfunction of medical devices); in the case where a contactless power feeding device is provided with a far distance from the power supply circuit.

As a result, in an electronic device including a power supply circuit that is operated by power supplied from a contactless power feeding device, and a load that is connected to the power supply circuit, the power supply potential $V_{dd}$ varies easily, and accordingly the problem of unstable operation occurs.

An example of an electronic device relating to such problems is a passive RFID tag including an OTP ROM. A memory element included in an OTP ROM needs high voltage in order to let current flow through a fuse or in order to inject an electric charge to a floating gate. Therefore, the high voltage is heavy load for the power supply circuit included in the passive RFID tag.

When data is sequentially written to a plurality of memory elements included in a memory circuit of a passive RFID tag with such a structure, the power supply circuit is intermittently connected to a load; therefore, the power supply potential $V_{dd}$ varies between the initial potential $V_{dd0}$ and the power supply potential $V_{dd1}$. As a result, the voltage for starting writing of data is different depending on a memory element and a problem in that wrong data is written to a memory element occurs.

Further, in the case where data is sequentially written to a plurality of memory elements, the voltage at which an electronic device that has not performed data writing operation starts writing of data to the first memory element is higher than the voltage for which the electronic device starts writing data to the sequent memory element. As a result, voltage for writing data becomes unstable and a problem of causing a writing defect occurs.

The present invention is made in view of the foregoing technical background. Therefore, an object of the present invention is to provide a method for stably driving an electronic device including a power supply circuit which is operated by power supplied from a contactless power feeding device, and a load to which power is intermittently supplied from the power supply circuit. Further, an object is to provide a method for stably driving an electronic device including a power supply circuit which is operated by power supplied from a contactless power feeding device, and one or more loads to which the power supply circuit repeatedly supplies power.

In order to achieve the objects, the present invention focuses on a period (also referred to as an interval) from when a power supply circuit to which power is fed by a contactless power feeding device is disconnected from a load to when the power supply circuit is connected to the next load. In other words, a period in which the power supply potential $V_{dd}$ is restored to more than or equal to 90% of the initial potential $V_{dd0}$ is provided after the power supply circuit is disconnected from the load and after that the power supply circuit is connected to the next load and the load is driven.

Furthermore, before connection of a desired load, the power supply circuit, to which power is fed by the contactless power feeding device, may be connected to a dummy load and the load may be driven.

Accordingly, an embodiment of the present invention is a driving method of an electronic device including a power supply circuit to which power is fed by a contactless power feeding device, a control circuit to which a power supply potential $V_{dd}$ is supplied from the power supply circuit, and a load circuit. When the power supply potential $V_{dd}$ of the power supply circuit connected to no load is an initial potential $V_{dd0}$, the driving method includes a first period in which the power supply circuit supplies power to a load included in the load circuit; a second period in which the power supply circuit stops supplying power to the load, and the power supply potential $V_{dd}$ is restored to more than or equal to 90% and less than 100% of the initial potential $V_{dd0}$; and a third period in which the power supply circuit supplies power to the load included in the load circuit. In the driving method, the second period and the third period are alternately repeated n times (n is an integer equal to or larger than 0).

According to an embodiment of the present invention, the power supply potential decreased by connection to the load circuit ($V_{dd1}$) can be restored to the power supply potential $V_{dd2}$ in the sequent second period (here, the power supply potential $V_{dd2}$ is more than or equal to 90% and less than 100% of the initial potential $V_{dd0}$). Thus, at the start of the third period, the power supply circuit can supply the stable power supply potential $V_{dd2}$ to the load circuit. Therefore, operation of the electronic device can be stabilized.

Further, an embodiment of the present invention is a driving method of an electronic device comprising a power supply circuit to which power is fed by a contactless power feeding device, a control circuit to which a power supply potential $V_{dd}$ is supplied from the power supply circuit, and a load circuit. When the power supply potential $V_{dd}$ of the power supply circuit connected to no load is an initial potential $V_{dd0}$ and the load circuit including a dummy load and an intrinsic load, the driving method includes a first period in which the power supply circuit supplies power to the dummy load included in the load circuit; a second period in which the power supply circuit stops supplying power to the intrinsic load included in the load circuit, and the power supply potential $V_{dd}$ is restored to more than or equal to 90% and less than 100% of the initial potential $V_{dd0}$; and a third period in which the power supply circuit supplies power to the intrinsic load included in the load circuit. In the driving method, the second period and the third period are alternately repeated n times (n is an integer equal to or larger than 0).

According to an embodiment of the present invention, the power supply potential decreased to the potential $V_{dd1}$ by connection of a power supply circuit to the dummy load in the first period can be restored to the power supply potential $V_{dd2}$ in the sequent second period (here, the power supply potential $V_{dd2}$ is more than or equal to 90% and less than 100% of the initial potential $V_{dd0}$). By limiting power supply potential $V_{dd}$ within the range of more than or equal to 90% and less than 100% of the initial potential $V_{dd0}$, the second period can be shorten and furthermore the power supply potential which is supplied from the power supply circuit to an intrinsic load can be stabilized to be the power supply potential $V_{dd2}$. Thus, at the start of the third period, the power supply circuit can supply the power supply potential $V_{dd2}$ to the load circuit. Therefore, operation of the electronic device can be stabilized.

Further, an embodiment of the present invention is the driving method of the electronic device in which the load includes an OTP ROM (one time programmable ROM).

According to an embodiment of the present invention, the power supply potential can be stably supplied to a plurality of memory elements included in the OTP ROM. Thus, writing of wrong data can be prevented.

Further, an embodiment of the present invention is the driving method of the electronic device, in which in the second period, data written just before the second period is verified and a verification result is output.

According to the embodiment of the present invention, not only the power supply potential can be supplied to the plurality of memory elements included in the OTP ROM, but also failure of data writing operation can be immediately discovered.

Further, an embodiment of the present invention is the driving method of the electronic device, in which in the second period, when data written just before the second period is verified and a verification result is output and a writing error is detected, a length of the third period is changed.

According to the embodiment of the present invention, not only the power supply potential can be stably supplied to the plurality of memory elements included in the OTP ROM, but also failure of data writing operation can be immediately discovered. Moreover, the length of the second period is changed in accordance with the verification result, so that the condition for writing data can be successively optimized.

According to the present invention, a method for stably driving an electronic device including a power supply circuit which is operated by power sequentially supplied from a contactless power feeding device, and a plurality of loads to which power is successively supplied from the power supply circuit, can be provided. Further, a method for stably driving an electronic device including a power supply circuit which is operated by power supplied from a contactless power feeding device, and one or more loads to which the power supply circuit repeatedly supplies power, can be provided.

DETAILED DESCRIPTION OF THE INVENTION

Figure 1:
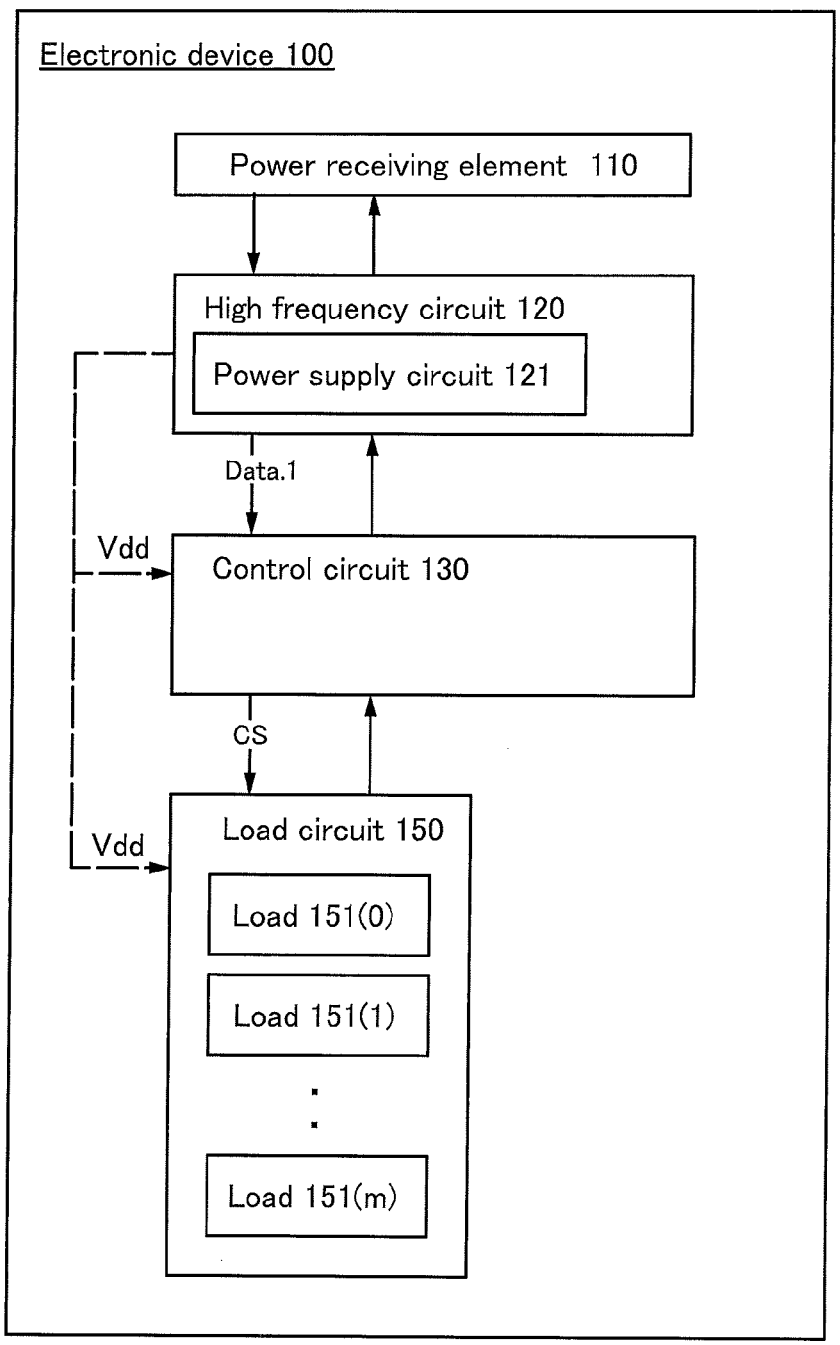
FIG. 1 is a block diagram illustrating a structure of an electronic device according to an embodiment.

Embodiments will be illustrated in detail with reference to the drawings. Note that the present invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is omitted.

Embodiment 1

In this embodiment, a method for driving an electronic device is illustrated with reference to FIG. 1, FIGS. 2A and 2B, and FIGS. 3A and 3B. The electronic device includes a power supply circuit which converts supplied contactlessly or wirelessly energy into power and supplies the power to another circuit, a control circuit, and a load circuit including a plurality of loads.

FIG. 1 illustrates an electronic device 100 in this embodiment, as an example. The electronic device 100 includes a power receiving element 110 receiving power supplied from a contactless power feeding device 190, a high frequency circuit 120 including a power supply circuit 121, a control circuit 130, and a load circuit 150 including (m+1) loads (151(0) to 151(m)) (m is an integer equal to or larger than 0).

The contactless power feeding device 190 supplies power to the electronic device 100 by using a carrier wave such as an electromagnetic wave. For example, an antenna can be used as the power receiving element 110 when the contactless power feeding device 190 generates power by using high frequency as a carrier wave.

Further, the contactless power feeding device 190 can modulate a carrier wave and can transmit a signal to the electronic device 100 together with power. Note that the contactless power feeding device 190 and the electronic device 100 may have a structure in which a plurality of carrier waves can be used. For example, the contactless power feeding device 190 may use light as a carrier wave for supply of power and may use a radio wave as a carrier wave for supply of a signal.

In this embodiment, a signal Data. 1 including power and a control signal is supplied from the contactless power feeding device 190 to the electronic device 100 by using high frequency wave. The electronic device 100 receives the power and the signal by receiving the high frequency wave with the use of an antenna as the power receiving element 110.

The high frequency circuit 120 includes the power supply circuit 121. The power supply circuit 121 generates the power supply potential $V_{dd}$ from the high frequency wave received by the power receiving element 110, and outputs the power supply potential $V_{dd}$ to the control circuit 130 and the load circuit 150. Note that in the case where a carrier wave is modulated by the signal Data. 1, the high frequency circuit 120 separates the signal Data. 1 from a carrier wave and outputs the signal Data. 1 to the control circuit 130.

The power receiving element 110 and the high frequency circuit 120 are electrically connected to each other. The high frequency circuit 120 is connected to the control circuit 130.

The control circuit 130 is operated by power supplied from the power supply circuit 121 and outputs a control signal CS to control the load circuit 150. In addition, the control circuit 130 can control the high frequency circuit 120 to transmit a modulated reflected wave to the contactless power feeding device 190.

As the load circuit 150, various circuits such as a memory circuit, a sensor circuit, or a display circuit, can be applied. In this embodiment, the case where the load circuit 150 includes (m+1) loads will be described.

Figure 2A:
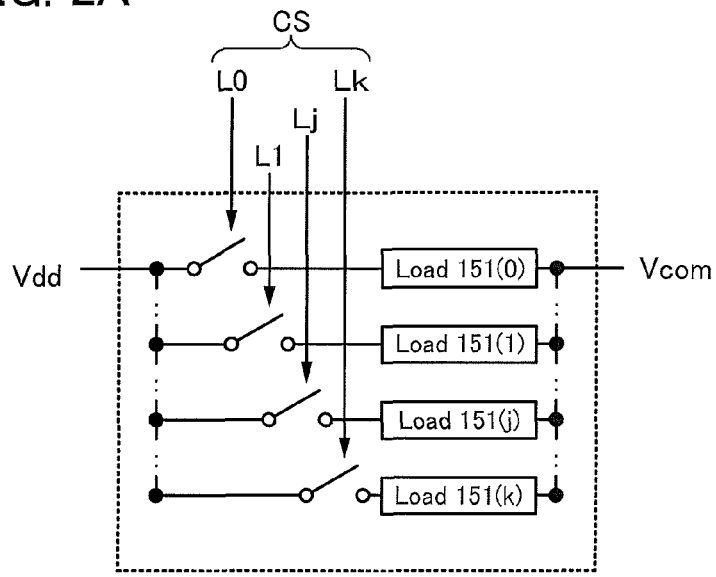
FIG. 2A is a diagram for illustrating a structure of the electronic device according to an embodiment and FIG. 2B is a timing diagram illustrating operation of the electronic device according to an embodiment.

A detail of a structure example of the load circuit 150 is described with reference to FIG. 2A. FIG. 2A illustrates a load 151(0), a load 151(1), a load 151(j), and a load 151(k) which are selected among (m+1) loads included in the load circuit 150. Note that j is an integer more than or equal to 2 and smaller than k, and k is an integer larger than j and smaller than or equal to m.

One of terminals of each load is supplied with the power supply potential $V_{dd}$ from the power supply circuit 121 through a switching element. Note that the other of the terminals of each load is connected to a common wiring COM. Note that a potential of the common wiring COM is a common potential $V_{com}$ and is lower than the power supply potential $V_{dd}$.

The control signal CS is a signal with which the control circuit 130 controls the load circuit 150, and includes address data and timing data. The control circuit 130 controls the load circuit 150 in accordance with data included in the signal Data. 1. Note that the address data is data specifying one load among (m+1) loads, and the timing data specifying open time, an open period, close time, and a close period of a switching element.

The control signal CS illustrated in FIG. 2A includes a control signal L0, a control signal L1, the control signal Lj, and the control signal Lk. The control signal L0 specifies the load 151(0) and determines open time and close time of a switching element connected to the load 151(0). The control signal L1 specifies the load 151(1) and determines open time and close time of a switching element connected to the load 151(1). The control signal Lj specifies the load 151(j) and determines open time and close time of a switching element connected to the load 151(j). The control signal Lk specifies the load 151(k) and determines open time and close time of a switching element connected to the load 151(k).

Figure 2B:
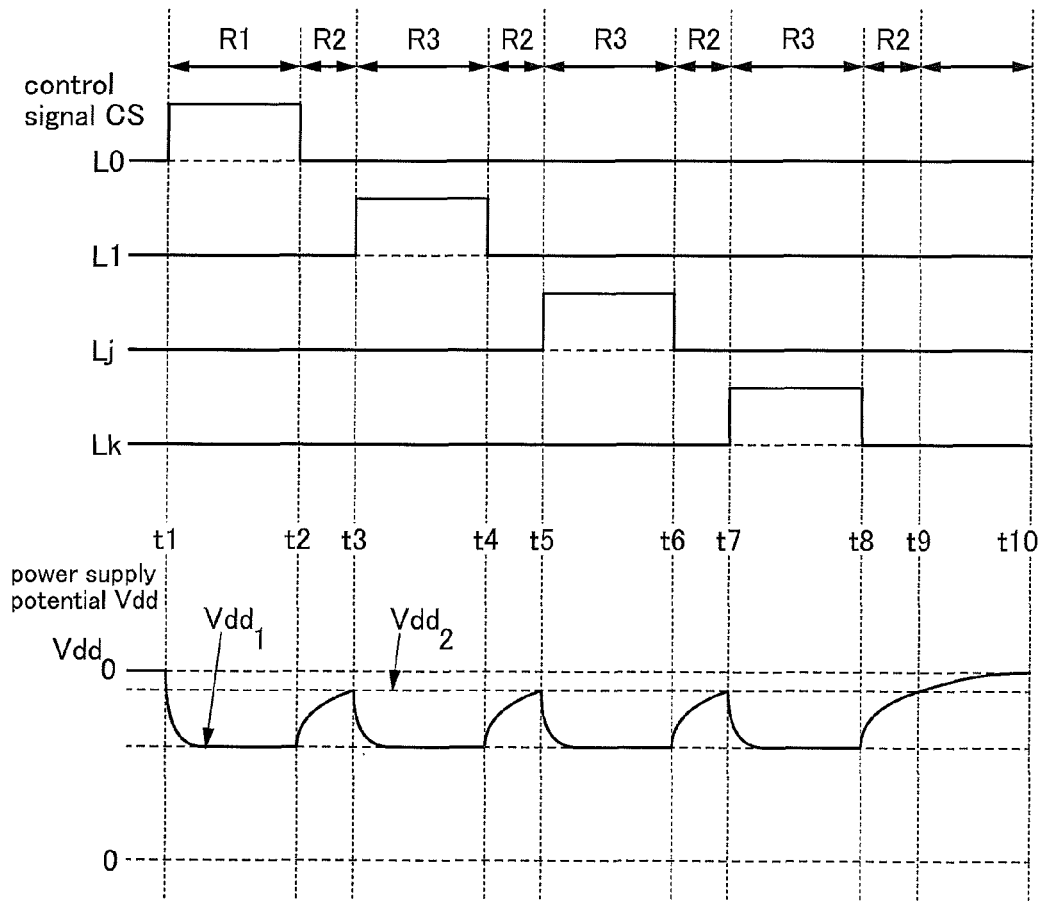

As an example in this embodiment, a method for driving the electronic device 100 is illustrated with reference to FIG. 2B. Note that before time t1, the power supply potential $V_{dd}$ is kept at the initial potential $V_{dd0}$ because the power supply circuit 121 is not connected any of the loads in the load circuit 150.

At first, the control circuit 130 selects the load 151(0) with the control signal CS including the control signal L0. Then, at the time t1 and during a first period R1, the load 151(0) is connected to the power supply circuit 121 and driven. As a result, the power supply potential $V_{dd}$ is decreased from the initial potential $V_{dd0}$ to the power supply potential $V_{dd1}$.

After the first period R1 passes (at time t2), the control circuit 130 disconnects the power supply circuit 121 from the load 151(0) by the control signal L0. The power supply potential $V_{dd}$ of the power supply circuit 121 disconnected from the load is increased from the power supply potential $V_{dd1}$ and approaches the initial potential $V_{dd0}$. Note that the power supply potential which is more than or equal to 90% and less than 100% of the initial potential $V_{dd0}$ is the power supply potential $V_{dd2}$. A period in which the power supply potential $V_{dd}$ of the power supply circuit 121 disconnected from the load is increased from the power supply potential $V_{dd1}$ to reach the power supply potential $V_{dd2}$ is a second period R2.

In this embodiment, power is supplied to a load included in the load circuit after the power supply potential $V_{dd}$ is restored to more than or equal to 90% and less than 100% of the initial potential $V_{dd0}$. The load is operated after the power supply potential $V_{dd}$ is restored to a specified level, so that the load is operated stably. Further, the power supply potential $V_{dd}$ is restored slowly as the power supply potential $V_{dd}$ approaches the initial potential $V_{dd0}$. Therefore, by setting the percentage of the power supply potential $V_{dd}$ to be restored to more than or equal to 90% of the initial potential $V_{dd0}$, malfunction of the load due to a shortage of the power supply potential $V_{dd}$ can be prevented and the period needed for the restoration can be shorten.

After the second period R2 passes (at time t3), the control circuit 130 selects the load 151(1) with the control signal CS including the control signal L1. Then, at the time t3 and during a third period R3, the load 151(1) is connected to the power supply circuit 121 and driven. Note that during the third period R3, the power supply potential $V_{dd}$ is decreased from the power supply potential $V_{dd2}$ to the power supply potential $V_{dd1}$.

After the third period R3 passes (at time t4), the control circuit 130 disconnects the power supply circuit 121 from the load 151(1) by the control signal L1. The power supply potential $V_{dd}$ of the power supply circuit 121 disconnected from the load is increased from the power supply potential $V_{dd1}$ and reaches the power supply potential $V_{dd2}$ at time t5 after the passage of the second period R2 from the time t4.

The control circuit 130 sequentially selects another load with the control signal and connects the load to the power supply circuit 121 to drive the load, as in the case of the load 151(0) and the load 151(1).

Specifically, the load 151(j) is connected to the power supply circuit 121 by the control signal Lj in the third period R3 from the time t5 to time t6, and is driven. After that, the power supply potential $V_{dd}$ of the power supply circuit 121 disconnected from the load 151(j) reaches the power supply potential $V_{dd2}$ at time t7 after the passage of the second period R2 from the time t6. Further, the load 151(k) is connected to the power supply circuit 121 by the control signal Lk in the third period R3 from the time t7 to time t8, and driven. After that, the power supply potential $V_{dd}$ of the power supply circuit 121 disconnected from the load 151(k) is restored from the time t8.

Modification Example

A method for driving an electronic device with the above structure is an embodiment of the present invention. The present invention also includes a method for driving an electronic device with a structure different from the above electronic device.

For example, the load circuit 150 may include a load 152(0) as a dummy load and m loads (152(1) to 152(m)) (m is an integer equal to or larger than 1) as intrinsic loads. Note that a dummy load is not particularly limited as long as the load decreases the power supply potential $V_{dd}$ by the same degree as in the case where the power supply circuit is connected to an intrinsic load. In addition, it is not necessary that the dummy load operate as accurately and stably as an intrinsic load. Note that the dummy load may have the same structure as an intrinsic load.

Figure 3A:
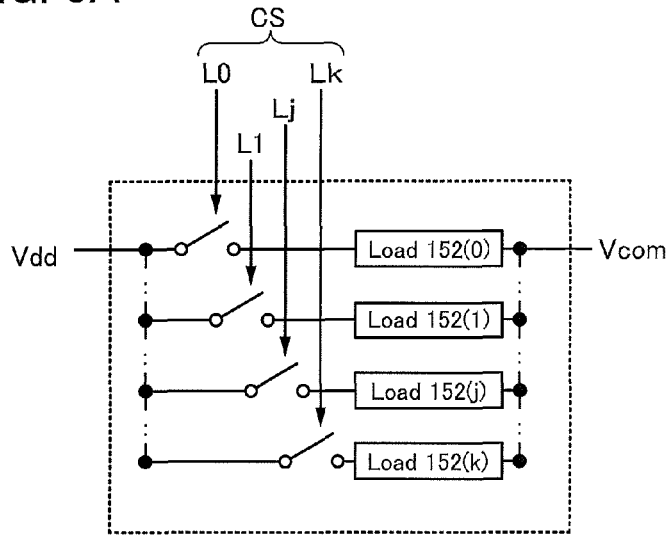
FIG. 3A is a diagram for illustrating a structure of the electronic device according to an embodiment and FIG. 3B is a timing diagram illustrating operation of the electronic device according to an embodiment.

The load circuit 150 including the dummy load is described with reference to FIG. 3A in detail. FIG. 3A illustrates the dummy load (the load 152(0)) and the intrinsic loads (the load 152(1), the load 152(j), and the load 152(k)) which are selected among (m+1) loads included in the load circuit 150. Note that j is an integer more than or equal to 2 and smaller than k, and k is an integer larger than j and smaller than or equal to m.

The control signal CS illustrated in FIG. 3A includes a control signal L0, a control signal L1, the control signal Lj, and the control signal Lk. The control signal L0 specifies the load 152(0) and determines open time and close time of a switching element connected to the load 152(0). The control signal L1 specifies the load 152(1) and determines open time and close time of a switching element connected to the load 152(1). The control signal Lj specifies the load 152(j) and determines open time and close time of a switching element connected to the load 152(j). The control signal Lk specifies the load 152(k) and determines open time and close time of a switching element connected to the load 152(k).

Figure 3B:
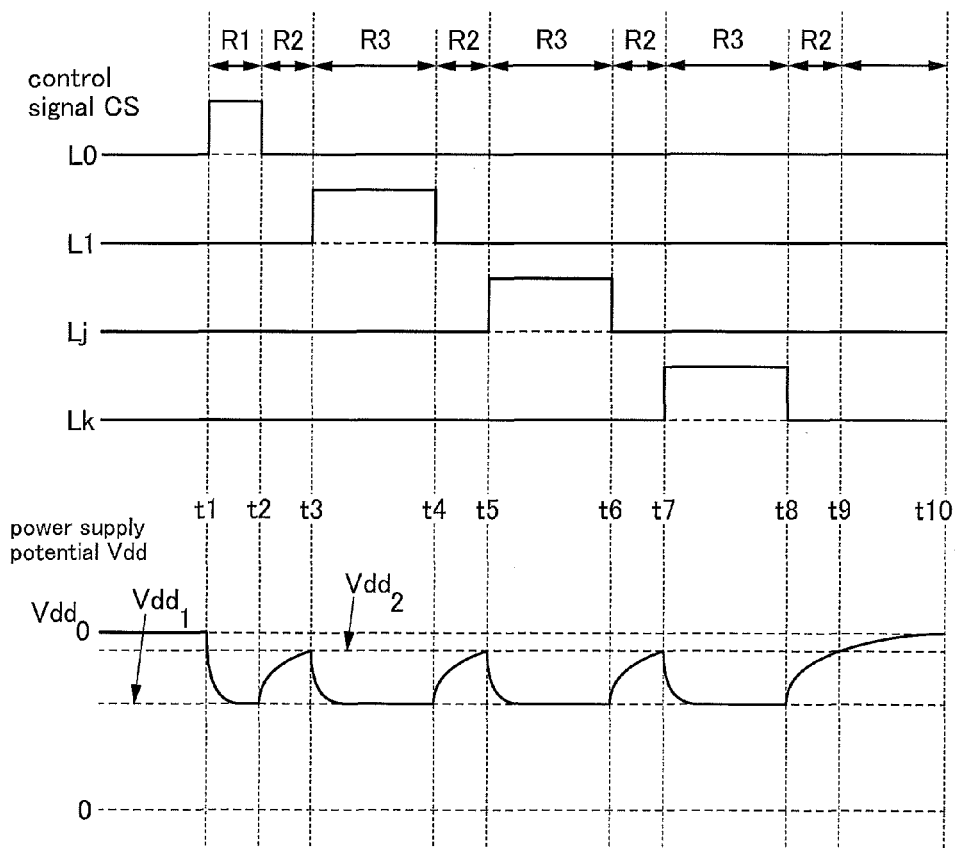

The method for driving the electronic device 100 in this modification example is illustrated with reference to FIG. 3B. Note that before time t1, the power supply potential $V_{dd}$ is kept at the initial potential $V_{dd0}$ because the power supply circuit 121 is not connected to any of the loads in the load circuit 150.

At first, the control circuit 130 selects the dummy load 152(0) with the control signal CS including the control signal L0. Then, at the time t1 and during the first period R1, the dummy load 152(0) is connected to the power supply circuit 121 and driven. As a result, the power supply potential $V_{dd}$ is decreased from the initial potential $V_{dd0}$ to the power supply potential $V_{dd1}$. Note that the first period R1 may be a period in which the power supply potential $V_{dd}$ of the power supply circuit 121 is decreased by the same degree as in the case where the power supply circuit 121 is connected to an intrinsic load. The shorter the first period R1 becomes, the shorter time for driving a load circuit becomes, which is preferable.

After the first period R1 passes (at time t2), the control circuit 130 disconnects the power supply circuit 121 from the dummy load 152(0) by the control signal L0. The power supply potential $V_{dd}$ of the power supply circuit 121 disconnected from the load is increased from the power supply potential $V_{dd1}$ and approaches the initial potential $V_{dd0}$. Note that the power supply potential which is more than or equal to 90% and less than 100% of the initial potential $V_{dd0}$ is the power supply potential $V_{dd2}$. A period in which the power supply potential $V_{dd}$ of the power supply circuit 121 disconnected from the dummy load is increased from the power supply potential $V_{dd1}$ to the power supply potential $V_{dd2}$ is a second period R2.

After the second period R2 passes (at time t3), the control circuit 130 selects the intrinsic load 152(1) with the control signal CS including the control signal L1. Then, at the time t3 and during a third period R3, the intrinsic load 152(1) is connected to the power supply circuit 121 and driven. Note that during the third period R3, the power supply potential $V_{dd}$ is decreased from the power supply potential $V_{dd2}$ to the power supply potential $V_{dd1}$.

After the third period R3 passes (at time t4), the control circuit 130 disconnects the power supply circuit 121 from the intrinsic load 152(1) by the control signal L1. The power supply potential $V_{dd}$ of the power supply circuit 121 disconnected from the intrinsic load is increased from the power supply potential $V_{dd1}$ and reaches the power supply potential $V_{dd2}$ at time t5 after the passage of the second period R2 from the time t4.

The control circuit 130 sequentially selects another intrinsic load with the control signal and connects the load to the power supply circuit 121 to drive the load, as in the case of the intrinsic load 152(1).

Specifically, the intrinsic load 152(j) is connected to the power supply circuit 121 by the control signal Lj in the third period R3 from the time t5 to time t6, and is driven. After that, the power supply potential $V_{dd}$ of the power supply circuit 121 disconnected from the intrinsic load 152(j) reaches the power supply potential $V_{dd2}$ at time t7 which comes after the passage of the second period R2 from the time t6. Further, the intrinsic load 152(k) is connected to the power supply circuit 121 by the control signal Lk in the third period R3 from the time t7 to time t8, and driven. After that, the power supply potential $V_{dd}$ of the power supply circuit 121 disconnected from the intrinsic load 152(k) is restored from the time t8.

According to the driving method illustrated in this embodiment, the power supply potential $V_{dd}$ in starting driving any load is determined to be more than or equal to 90% of the initial potential $V_{dd0}$. Therefore, the load and an electronic device including the load can be operated stably.

Further, the power supply potential supplied to an intrinsic load can be stabilized to the power supply potential $V_{dd2}$ by the following driving method: a power supply circuit is connected to a dummy load, so that the power supply potential $V_{dd}$ is decreased from the initial potential $V_{dd0}$; after that, after the power supply potential $V_{dd}$ have reached the power supply potential $V_{dd2}$ which is more than or equal to 90% and less than 100% of the initial potential $V_{dd0}$, the power supply circuit is connected to an intrinsic load. Thus, the power supply potential $V_{dd}$ in starting driving any load is determined to be more than or equal to 90% to less than 100% of the initial potential $V_{dd0}$. Therefore, the load and an electronic device including the load can be operated stably.

Further, the second period R2 is a period in which the power supply potential $V_{dd}$ is restored to more than or equal to 90% to less than 100% of the initial potential $V_{dd0}$; therefore, the second period R2 can be shorter than a period in which the power supply potential $V_{dd}$ is restored to 100% of the initial potential $V_{dd0}$. Thus, the load and an electronic device including the load can be operated stably, and an operation period of the electronic device including the load connected to the power supply circuit can be short.

Embodiment 2

In this embodiment, a method for driving a passive RFID tag including an OTP ROM as a load circuit will be described with reference to FIG. 4 and FIG. 5. In particular, the following driving method will be described: in a period that a power supply circuit to which power is fed by the contactless power feeding device is disconnected from a memory element, and the power supply potential $V_{dd}$ is restored to more than or equal to 90% of the initial potential $V_{dd0}$, by reading data from the memory element to which the data has just been written, judging whether the data is correctly written; and specifying the address data of a memory to be sequentially written with data.

Figure 4:
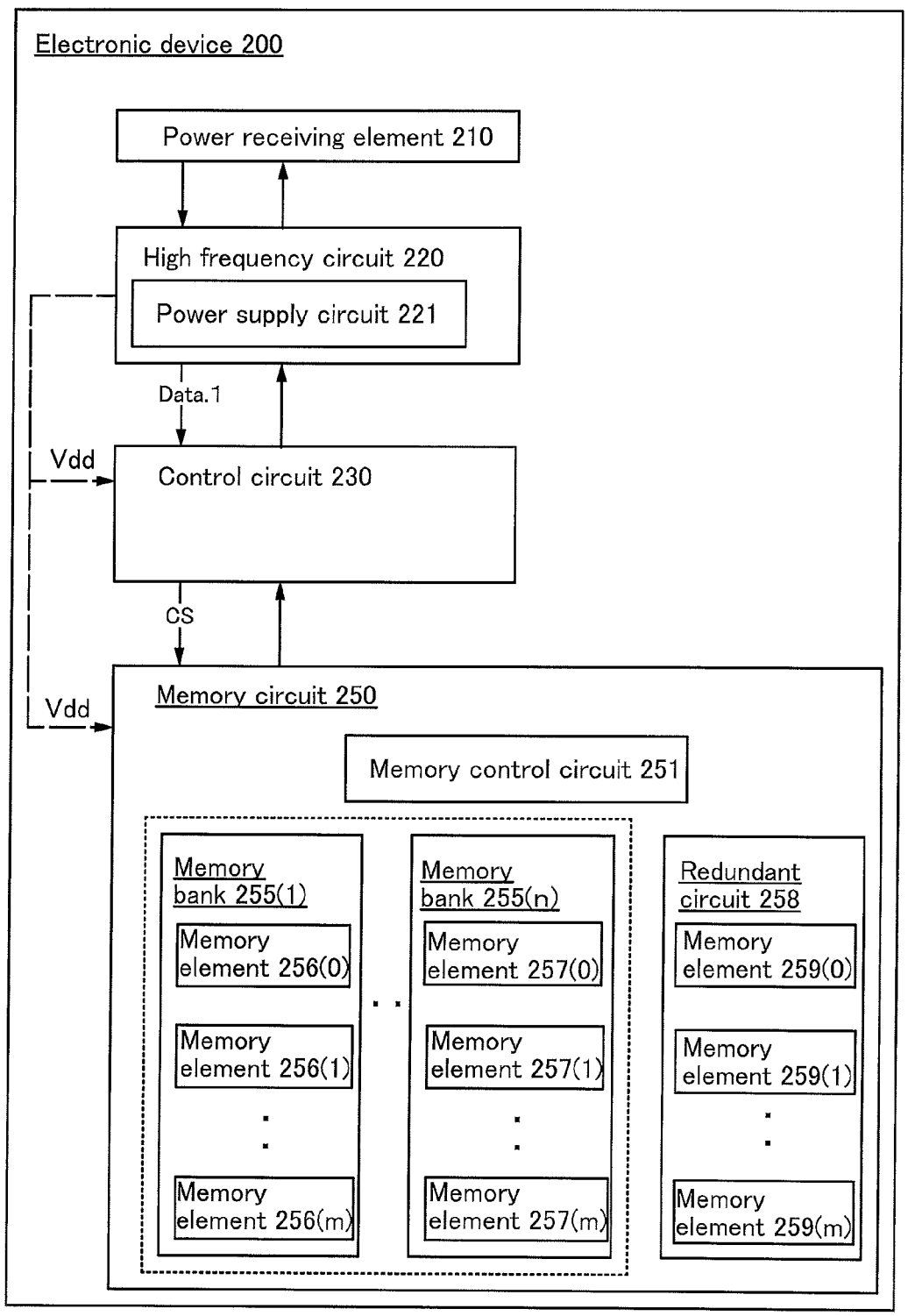
FIG. 4 is a block diagram illustrating a structure of an electronic device according to an embodiment.
Figure 5:
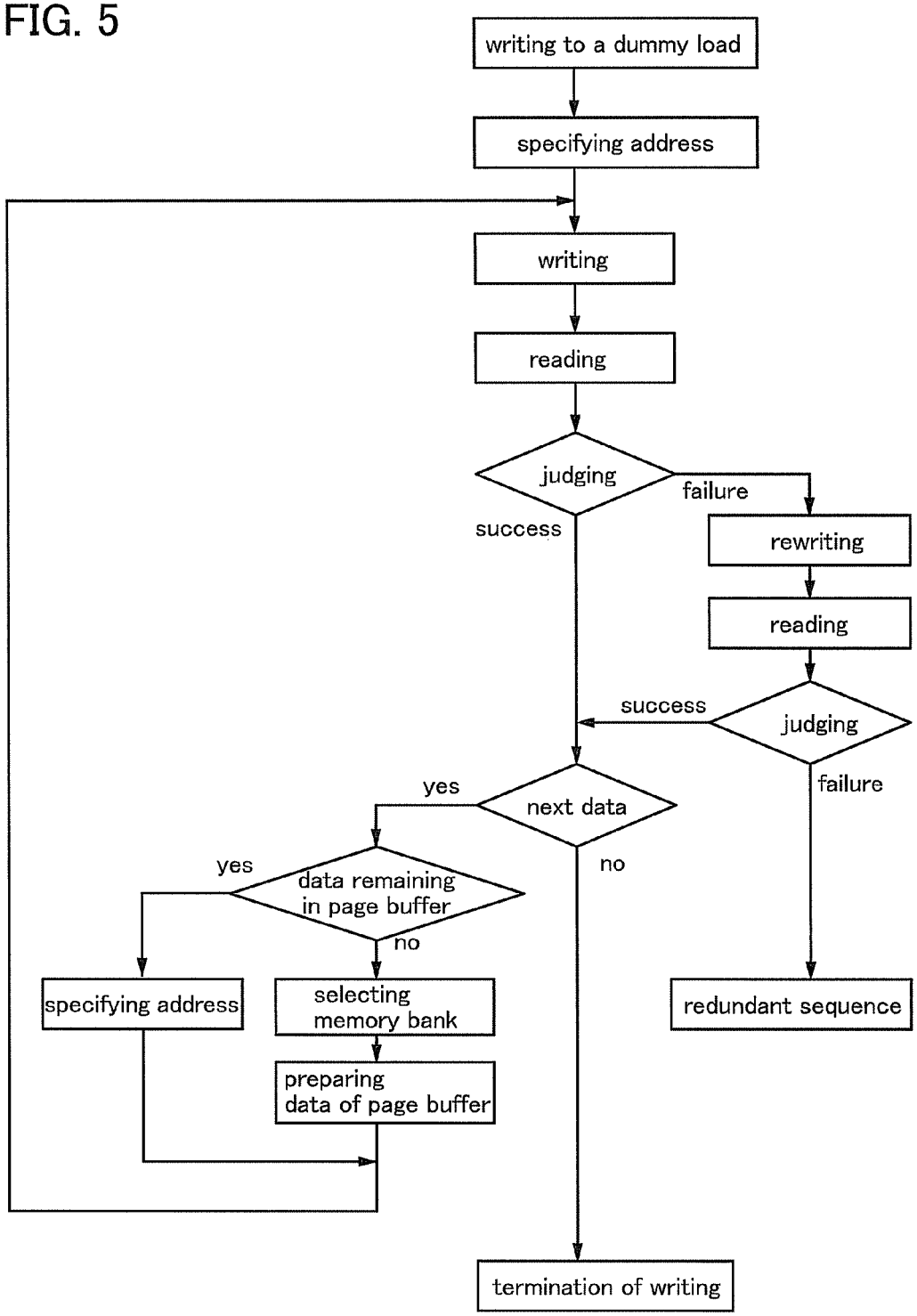
FIG. 5 is a flow chart illustrating a method for driving an electronic device according to an embodiment.

FIG. 4 illustrates an electronic device 200 in this embodiment. The electronic device 200 is a passive RFID tag. The electronic device 200 includes a power receiving element 210 receiving power generated by a contactless power feeding device 290, a high frequency circuit 220 including a power supply circuit 221, a control circuit 230, and a memory circuit 250.

The contactless power feeding device 290 is a reader/writer of an RFID tag. The contactless power feeding device 290 supplies power and the signal Data. 1 to the electronic device 200 by using high frequency wave as a carrier wave. The electronic device 200 receives the power and the signal from the high frequency wave by using an antenna which is the power receiving element 210.

The high frequency circuit 220 includes the power supply circuit 221. The power supply circuit 221 generates the power supply potential $V_{dd}$ from the high frequency wave received by the power receiving element 210, and outputs the power supply potential $V_{dd}$ to the control circuit 230 and the memory circuit 250. Note that the high frequency circuit 220 separates the signal Data. 1 from the carrier wave and outputs the signal Data. 1 to the control circuit 230.

The power receiving element 210 and the high frequency circuit 220 are electrically connected to each other. The high frequency circuit 220 is connected to the control circuit 230.

The control circuit 230 is operated by the power supplied from the power supply circuit 221 and outputs a control signal CS to control the memory circuit 250. In addition, the control circuit 230 controls the high frequency circuit 220 to transmit a modulated reflected wave to the contactless power feeding device 290.

The memory circuit 250 is an OTP ROM. The memory circuit 250 includes n memory banks 255(1) to 255(n) (n is a natural number), a redundant circuit 258, and a memory control circuit 251.

A memory bank is a unit to be controlled by the memory control circuit 251. Each memory bank includes (m+1) memory cells (m is an integer equal to or larger than 0) which can be specified by address data. For example, the memory bank 255(1) includes a memory element 256(0) functioning as a dummy load and memory elements 256(1) to 256(m). Furthermore, the memory bank 255(n) includes a memory element 257(0) functioning as a dummy load and memory element 257(1) to 257(m).

The redundant circuit 258 is a spare circuit for a memory bank. The redundant circuit 258 is utilized for storing an alternative to a defective memory element in a memory bank. The redundant circuit 258 includes (m+1) memory elements which can be specified by the address data, specifically, a memory element 259(0) functioning as a dummy load and memory elements 259(1) to 259(m).

The memory control circuit 251 selects a memory element, which address data indicates, from the plurality of memory banks or the redundant circuit 258; writes data to the memory element; and reads the data from the memory element. Note that the memory control circuit 251 includes a page buffer. For example, the memory control circuit 251 includes a page buffer having capacity, the amount of which corresponds to one row of a memory bank. After data corresponding to the memory bank of the one row of the memory bank is temporarily stored in the page buffer, data is sequentially written to memory elements in a memory bank.

Next, the electronic device 200 performs response operation when the electronic device 200 receives the signal Data. 1 including a data writing command which the contactless power feeding device 290 outputs. The response operation will be described.

The control circuit 230 recognizes the signal Data. 1 and outputs the control signal CS including the data writing command to the memory circuit 250. The memory circuit 250 temporarily stores data, which corresponds to one row of a memory bank and which is from the signal Data. 1, in a page buffer in accordance with the control signal CS. After that, data starts being written to the memory bank.

Figure 6:
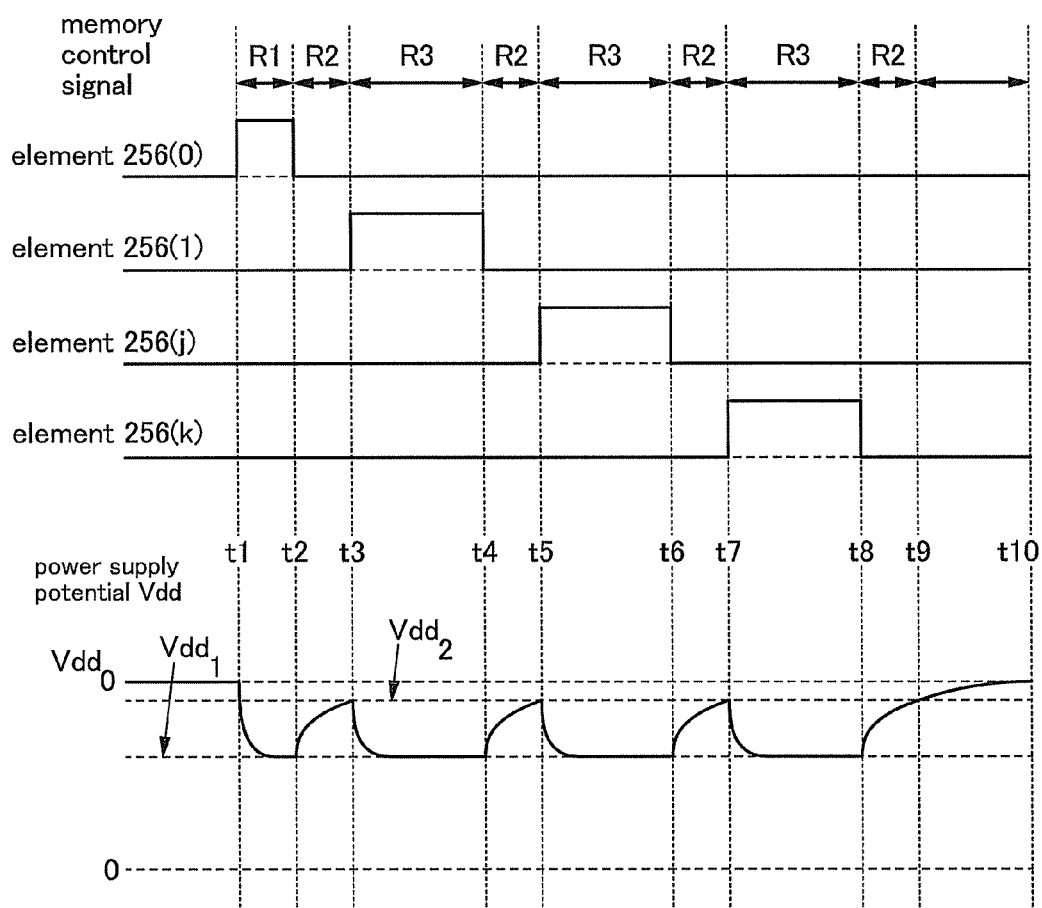
FIG. 6 is a timing diagram illustrating operation of an electronic device according to an embodiment.

A method in which the memory circuit 250 writes the signal Data. 1 to the memory bank will be described in detail with reference to a flow chart in FIG. 5 and a timing diagram in FIG. 6.

By the control signal CS including the data writing command, the memory control circuit 251 connects the memory element 256(0) functioning as a dummy load to the power supply circuit 221 at the time t1 and during the first period R1. As a result, the power supply potential $V_{dd}$ is decreased from the initial potential $V_{dd0}$ to the power supply potential $V_{dd1}$.

After the first period R1 passes (at the time t2), the memory control circuit 251 disconnects the power supply circuit 221 from the memory element 256(0) functioning as a dummy load. The power supply potential $V_{dd}$ of the power supply circuit 221 disconnected from the dummy load is increased from the power supply potential $V_{dd1}$ and approaches the initial potential $V_{dd0}$. After the second period R2 passes (at the time t3), the power supply potential $V_{dd}$ is restored to the power supply potential $V_{dd1}$ which is more than or equal to 90% and less than 100% of the initial potential $V_{dd0}$.

Note that in the second period R2 from the time t2 to the time t3, the memory control circuit 251 specifies address data of a memory element to which the first data Data. 1(1) of the signal Data. 1 is written. Note that in this embodiment, the first data Data. 1(1) of the signal Data. 1 is written to the memory element 256(1).

At the time t3 and during the third period R3, the memory control circuit 251 connects the specified memory element 256(1) to the power supply circuit 221, and writes the first data Data. 1(1) of the signal Data. 1 to the memory element 256(1). Note that during the third period R3, the power supply potential $V_{dd}$ is decreased from the power supply potential $V_{dd2}$ to the power supply potential $V_{dd1}$.

After the third period R3 passes (at the time t4), the memory control circuit 251 disconnects the memory element 256(1) from the power supply circuit 221. The power supply potential $V_{dd}$ of the power supply circuit 221 disconnected from the load is increased from the power supply potential $V_{dd1}$ and approaches the initial potential $V_{dd0}$. After the second period R2 passes (at the time t5), the power supply potential Vdd is restored to the power supply potential $V_{dd2}$ which is more than or equal to 90% and less than 100% of the initial potential $V_{dd0}$.

Note that in the second period R2 from the time t4 to the time t5, the memory control circuit 251 reads data from the last memory element 256(1) to which data is written and judges whether data is correctly written. When data is failed in being written, "data rewriting operation" to be described below is performed. When data succeeds in being written, it is confirmed that the next data exists in the signal Data. 1. Note that the next data is j-th data (j is a natural number more than or equal to 2 and smaller than m). The j-th data Data. 1(j) of the signal Data. 1 is written to a memory element 256 (j). Further, when the next data does not exist, the data writing operation is terminated.

When the j-th data Data. 1(j) exists in the page buffer, the address data of the memory element to which the data is written is specified. Further, in the case where all data of the page buffer is written and the page buffer does not include the j-th data Data. 1(j), the next memory bank is selected and data of the page buffer is prepared by overwriting data in the page buffer with data including the j-th data Data. 1(j).

Then, "data rewriting operation" will be described. When data is not correctly written to the last memory element to which data is written, the same data is rewritten to the same memory element. After that, the data is read again to judge whether the data is correctly written to the memory element.

For example, when the first data Data. 1(1) of the signal Data. 1 is not correctly written to the memory element 256(1), the first data Data. 1(1) of the signal Data. 1 is rewritten to the memory element 256(1). After the data writing operation, the data is read from the memory element 256(1) to judge whether the data is correctly written. When the data rewriting operation succeeds, operation proceeds to the operation for confirming whether the above signal Data. 1 has the next data. Note that in the case where the data rewriting operation is failed, operation proceeds to "redundant sequence".

The "redundant sequence" is a sequent process for replacing the memory element to which the data is failed in being rewritten with the memory element of the redundant circuit 258. The electronic device 200 is driven by replacing the memory element to which data is failed in being written with the memory element of the redundant circuit 258; accordingly, the electronic device 200 becomes more highly reliable. Note that the memory bank including a memory element to which data is failed in being written can be replaced with another memory bank, for example.

As described above, a process after data is written and a process for writing next data are changed depending on the judgment result, and processing time may have various lengths.

In this embodiment, regardless of the length of the processing time, power is stably supplied to a load included in the load circuit by providing the second period in which the power supply potential $V_{dd}$ is restored to more than or equal to 90% and less than 100% of the initial potential $V_{dd0}$. The load is operated after the specified power supply potential $V_{dd2}$ is restored, so that the load is operated stably. Further, the power supply potential $V_{dd}$ is restored slowly as approaching the initial potential $V_{dd0}$. Therefore, by setting the percentage of the power supply potential $V_{dd}$ to be restored to more than or equal to 90% of the initial potential $V_{dd0}$, malfunction of the load due to the shortage of the power supply potential $V_{dd}$ can be prevented and the period for restoring the power supply potential $V_{dd}$ can be shorten.

At the time t5 and during the third period R3, the memory control circuit 251 connects the specified memory element 256(j) to the power supply circuit 221, and writes the j-th data Data. 1(j) of the signal Data. 1 to the memory element 256(j). Note that during the third period R3, the power supply potential $V_{dd}$ is decreased from the power supply potential $V_{dd2}$ to the power supply potential $V_{dd1}$.

After the third period R3 passes (at the time t6), the memory control circuit 251 disconnects the memory element 256(j) from the power supply circuit 221. The power supply potential $V_{dd}$ of the power supply circuit 221 disconnected from the load is increased from the power supply potential $V_{dd1}$ and approaches the initial potential $V_{dd0}$. After the second period R2 passes (at the time t7), the power supply potential $V_{dd}$ is restored to the power supply potential $V_{dd2}$ which is more than or equal to 90% and less than 100% of the initial potential $V_{dd0}$.

Note that in the second period R2 from the time t6 to the time t7, the memory control circuit 251 reads data from the last memory element 256(j) to which data is written and judges whether data is correctly written. When data is failed in being written, "data rewriting operation" is performed.

In the case where data succeeds in being written, the k-th data Data. 1(k) which is the k-th data of the signal Data. 1(k) is an integer larger than j and equal to and smaller than m) and the last data is written to a memory element 256(k).

When the k-th data Data. 1(k) exists in the page buffer, the address data of the memory element to which the data is written is specified. Further, in the case where all data of the page buffer is written and the page buffer does not include the k-th data Data. 1(k), the next memory bank is selected and data of the page buffer is prepared by overwriting data in the page buffer with data including the k-th data Data. 1(k).

At the time t7 and during the third period R3, the memory control circuit 251 connects the specified memory element 256(k) to the power supply circuit 221, and writes the k-th data Data. 1(k) of the signal Data. 1 to the memory element 256(k). Note that during the third period R3, the power supply potential $V_{dd}$ is decreased from the power supply potential $V_{dd2}$ to the power supply potential $V_{dd1}$.

After the third period R3 passes (at the time t8), the memory control circuit 251 disconnects the memory element 256(k) from the power supply circuit 221. The power supply potential $V_{dd}$ of the power supply circuit 221 disconnected from the load is restored from the power supply potential $V_{dd1}$ and approaches the initial potential $V_{dd0}$.

Note that in the second period R2 from the time t8 to the time t9, the memory control circuit 251 reads data from the last memory element 256(k) to which data is written and judges whether data is correctly written. When data is failed in being written, "data rewriting operation" is performed. When data succeeds in being written, it is confirmed that the next data does not exist in the signal Data. 1 and data writing operation is terminated.

Modification Example

The method for driving an electronic device with the structure is an embodiment of the present invention. The present invention also includes a method for driving an electronic device, with a structure different from the above electronic device.

For example, in the "data rewriting operation", data writing time can be longer than data writing time when data is failed in being written. The data writing time is longer, so that conditions for writing data can be optimized as appropriate. Note that the length of the data writing time may vary only in the data rewriting operation or in the data rewriting operation and normal data writing operation.

With the driving method illustrated in this embodiment, in the case of starting writing data to any of memory elements, the power supply potential $V_{dd}$ supplied to a memory circuit is determined to be more than or equal to 90% of the initial potential $V_{dd0}$. As the result, the operation of writing data to the memory element and the operation of an electronic device including the memory element can be stabilized.

Further, the power supply potential supplied to an intrinsic load can be stabilized at the power supply potential $V_{dd2}$ by the following driving method: a power supply circuit is connected to a dummy load, so that the power supply potential $V_{dd}$ is decreased from the initial potential $V_{dd0}$; after that, after the power supply potential $V_{dd}$ reaches the power supply potential $V_{dd2}$ which is more than or equal to 90% and less than 100% of the initial potential $V_{dd0}$, the power supply circuit is connected to an intrinsic load (a memory element). Thus, the power supply potential $V_{dd}$ in starting driving of any load is determined to be more than or equal to 90% to less than 100% of the initial potential $V_{dd0}$. Therefore, the load (a memory element) and an electronic device including the load (a memory element) can be operated stably.

Further, the second period R2 is a period in which the power supply potential $V_{dd}$ is restored to more than or equal to 90% to less than 100% of the initial potential $V_{dd0}$, which is shorter than a period in which the power supply potential $V_{dd}$ is restored to 100% of the initial potential $V_{dd0}$. Thus, the load and an electronic device of the load (a memory element) can be operated stably, and an operation period the electronic device including the load (a memory element) connected to the power supply circuit can be short.

Further, in the second period R2, data written to the last memory element is verified, and rewriting data or replacement of a memory element with that in a redundant circuit is performed in accordance with the verification result. Therefore, failure of data writing operation can be immediately discovered and wrong data is prevented from being written.

Further, in the second period R2, data written to the last memory element is verified, and data writing time is optimized in accordance with the verification result. Therefore, failure of data writing operation can be immediately discovered. Moreover, the length of the second period is changed in accordance with the verification result, so that the condition for writing data can be optimized depending on the result.

This embodiment can be freely combined with any of the other embodiments in this specification.

Embodiment 3

In this embodiment, a method for driving a passive electronic device including a sensor circuit and a non-volatile memory circuit as load circuits will be described with reference to FIG. 7. Specifically, the following driving method will be described: a power supply circuit which converts supplied contactlessly or wirelessly energy into power and supplies the power to another circuit is disconnected from a sensor element or a memory element, and the power supply potential $V_{dd}$ is restored to more than or equal to 90% of the initial potential $V_{dd0}$.

Note that the electronic device in this embodiment is operated by power supplied from a contactless power feeding device and stores data, which is detected by the sensor element, in a non-volatile memory. Further, data stored in the non-volatile memory of the electronic device can be read in accordance with a command given by the contactless power feeding device.

Figure 7:
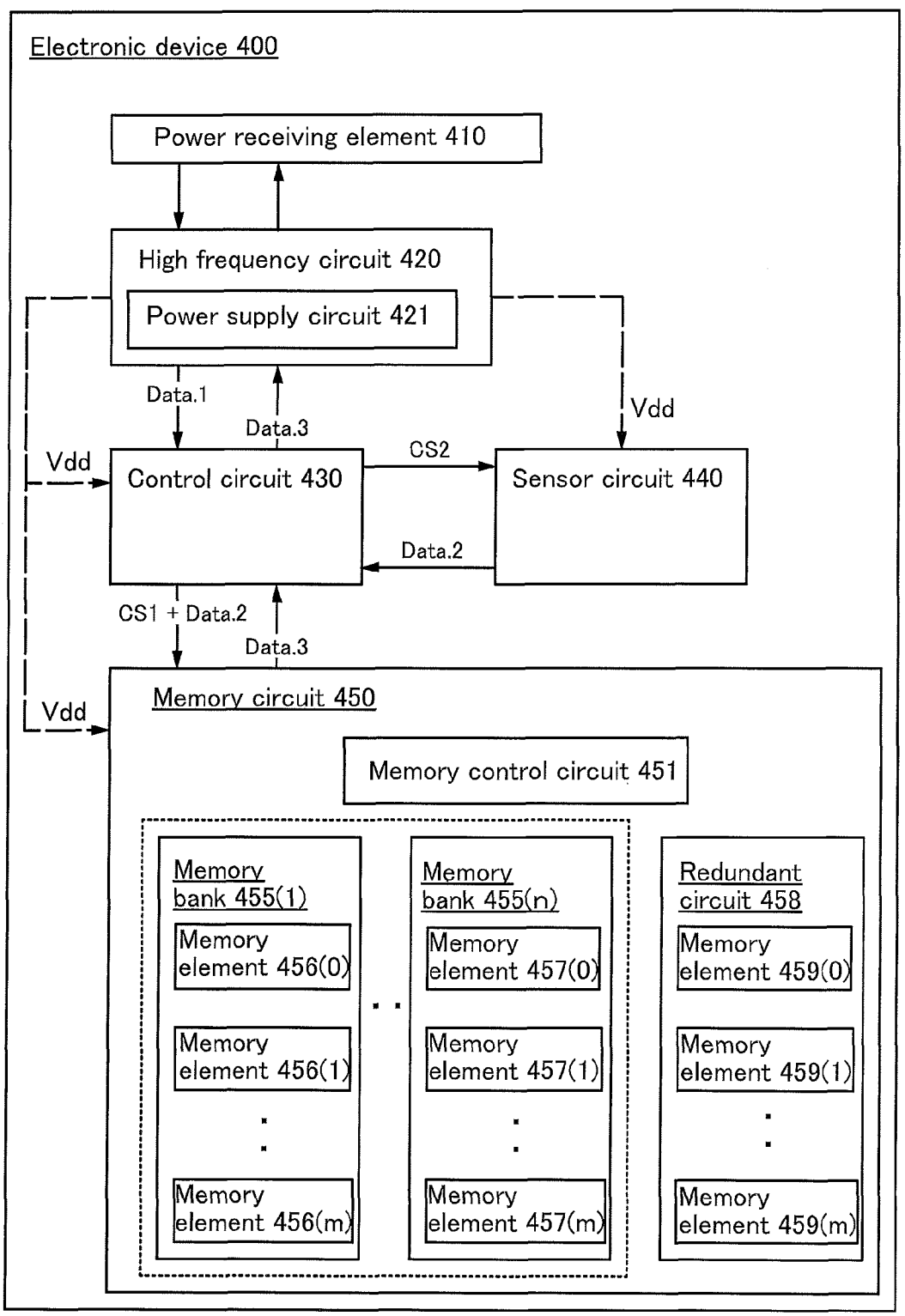
FIG. 7 is a block diagram illustrating a structure of an electronic device according to an embodiment.

FIG. 7 illustrates an electronic device 400 in this embodiment. The electronic device 400 is a passive electronic device including a sensor circuit and a non-volatile memory circuit as load circuits. The electronic device 400 includes a power receiving element 410 receiving power from a contactless power feeding device 490, a high frequency circuit 420 including a power supply circuit 421, a control circuit 430, a memory circuit 450, and a sensor circuit 440.

The contactless power feeding device 490 is a reader/writer of a passive electronic device 400 including a sensor circuit and a non-volatile memory. The contactless power feeding device 490 supplies power and the signal Data. 1 to the electronic device 400 by using high frequency wave as a carrier wave. The electronic device 400 receives the power and the signal which are generated from the high frequency wave by using an antenna which is the power receiving element 410.

The high frequency circuit 420 includes the power supply circuit 421. The power supply circuit 421 generates the power supply potential $V_{dd}$ from the high frequency received by the power receiving element 410, and outputs the power supply potential $V_{dd}$ to the control circuit 430, the sensor circuit 440, and the memory circuit 450. Note that the high frequency circuit 420 separates the signal Data. 1 from a carrier wave and outputs the signal Data. 1 to the control circuit 430.

The power receiving element 410 and the high frequency circuit 420 are electrically connected to each other. The high frequency circuit 420 is connected to the control circuit 430.

The control circuit 430 is operated by the power supplied from the power supply circuit 421 and outputs a control signal CS1 to control the memory circuit 450. Further, the control circuit 430 is connected to the sensor circuit 440 and outputs a control signal CS2 to control the sensor circuit 440. Note that the control circuit 430 can control the high frequency circuit 420 to transmit a modulated reflected wave to the contactless power feeding device 490.

The sensor circuit 440 includes a sensor element and an AD converter which converts an analog signal output from the sensor element into a digital signal. Further, the sensor circuit 440 outputs a signal Data. 2 output from the sensor element to the control circuit 430. As the sensor element, various sensor elements can be used; for example, a sensor element detecting temperature, pressure, light, acceleration, or intracardiac detection potential (ECG). In addition, a plurality of changes in environment can be recorded by providing a plurality of various sensors. For example, a plurality of environments may be measured at approximately the same time, each environment may be measured by switching sensor elements, and each environment may be measured at time specified for each sensor element. Further, for example, the same sensors are arranged in matrix, so that the change in environment can be detected in a plane manner.

The memory circuit 450 is not limited as long as it includes the non-volatile memory; for example, a memory circuit similar to an OTP ROM which is illustrated in Embodiment 2 can be used. For the details, Embodiment 2 can be referred to.

Figure 8:
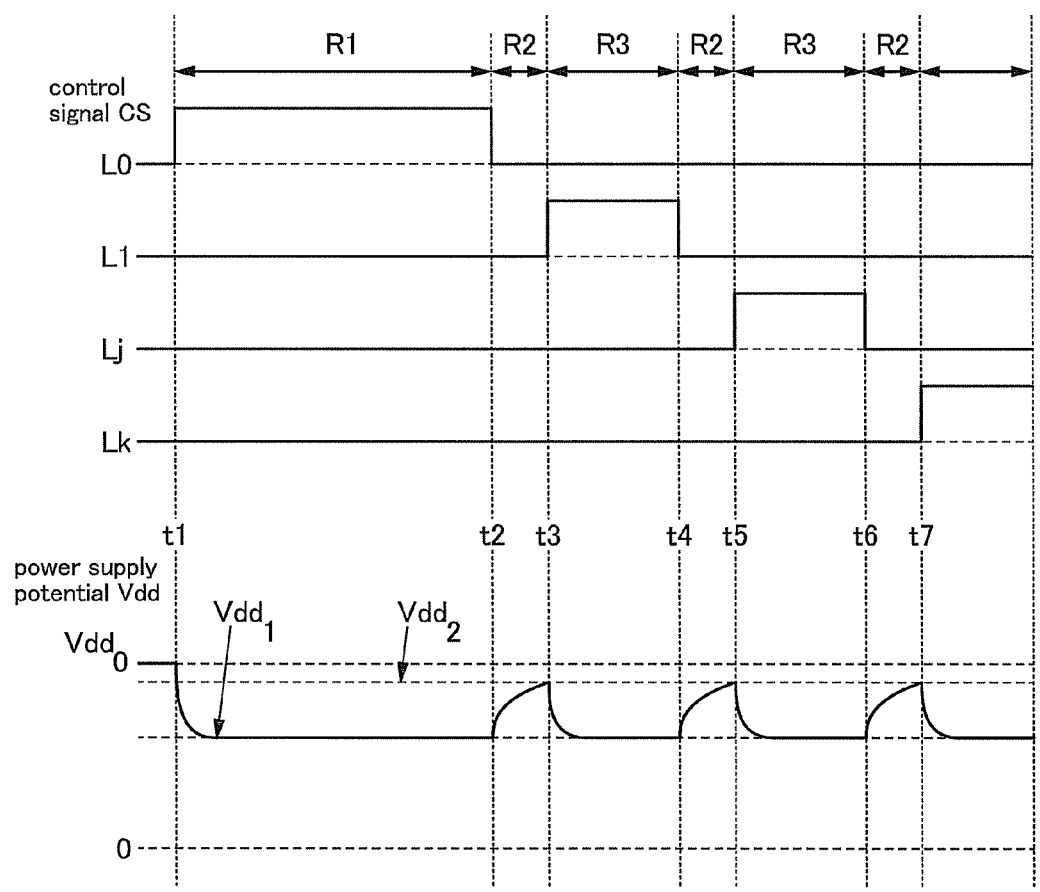
FIG. 8 is a timing diagram illustrating operation of an electronic device according to an embodiment.

As an example in this embodiment, a method for driving the electronic device 400 is illustrated with reference to FIG. 8. Note that before time t1, the power supply potential $V_{dd}$ is kept at the initial potential $V_{dd0}$ because the power supply circuit 421 is not connected any of the loads in the sensor circuit 440 or the memory circuit.

At first, the contactless power feeding device 490 outputs a command included in the signal Data. 1 to the control circuit 430. The control circuit 430 connects the sensor circuit 440 to the power supply circuit 421 by using the control signal CS2. As a result, the power supply potential $V_{dd}$ is decreased from the initial potential $V_{dd0}$ to the power supply potential $V_{aa1}$. Note that the sensor circuit 440 converts an output from the sensor element to the digital data Data. 2, and outputs the digital data Data. 2 to the control circuit 430.

After the first period R1 passes (at time t2), the control circuit 430 disconnects the power supply circuit 421 from the sensor element by the control signal CS2. The power supply potential $V_{dd}$ of the power supply circuit 421 disconnected from the load is increased from the power supply potential $V_{dd1}$ and approaches the initial potential $V_{dd0}$. Note that the power supply potential which is more than or equal to 90% and less than 100% of the initial potential $V_{dd0}$ is the power supply potential $V_{dd2}$. A period in which the power supply potential $V_{dd}$ of the power supply circuit 421 disconnected from the load is increased from the power supply potential $V_{dd1}$ to the power supply potential $V_{dd2}$ is a second period R2.

Note that in the second period R2 from the time t2 to the time t3, the control circuit 430 outputs the digital data Data. 2 output from the sensor circuit 440 to the memory circuit 450, and the memory control circuit 451 specifies address data of a memory element to which the first data Data. 2(1) of the signal Data. 2 is written. Note that in this embodiment, the first data Data. 2(1) of the signal Data. 2 is written to the memory element 456(1).

At the time t3 and during the third period R3, the memory control circuit 451 connects the specified memory element 456(1) to the power supply circuit 421, and writes the first data Data. 2(1) of the signal Data. 2 to the memory element 456(1). Note that during the third period R3, the power supply potential $V_{dd}$ is decreased from the power supply potential $V_{dd2}$ to the power supply potential $V_{dd1}$.

In this embodiment, the power supply circuit 421 is connected to a plurality of loads, which decreases the power supply potential $V_{dd}$ of the power supply circuit 421. Specifically, the sensor circuit 440 and the memory circuit 450 are connected. In such a configuration, periods in which the power supply circuit 421 is connected to each of loads are not necessarily the same; for example, the lengths of periods may be different like R1 and R3.

After the third period R3 passes (at the time t4), a memory control circuit 451 disconnects a memory element 456(1) from the power supply circuit 421. The power supply potential $V_{dd}$ of the power supply circuit 421 disconnected from the load is increased from the power supply potential $V_{dd1}$ and approaches the initial potential $V_{dd0}$. After the second period R2 passes (at the time t5), the power supply potential Vdd is restored to the power supply potential $V_{dd2}$ which is more than or equal to 90% and less than 100% of the initial potential $V_{dd0}$.

Note that in the second period R2 from the time t4 to the time t5, the memory control circuit 451 reads data from the last memory element 456(1) to which data is written and judges whether data is correctly written. When data is failed in being written, "data rewriting operation" described in Embodiment 2 is performed. When data succeeds in being written, it is confirmed that the next data exists in the signal Data. 1. Note that the next data is j-th data (j is a natural number more than or equal to 2 and smaller than m). The j-th data Data. 2 (j) of the signal Data. 2 is written to a memory element 456 (j). Further, when the next data does not exist, the data writing operation is terminated.

When the j-th data Data. 2(j) exists in the page buffer, the address data of the memory element to which the data is written is specified. Further, in the case where all data of the page buffer is written and the page buffer does not include the j-th data Data. 2(j), the next memory bank is selected and data of the page buffer is prepared by overwriting data in the page buffer with data including the j-th data Data. 2(j).

At the time t5 and during the third period R3, the j-th data Data. 2(j) is written to the specified memory element. During the second period R2 from the time t6 to the time t7, the power supply potential $V_{dd}$ is restored to the power supply potential $V_{dd2}$.

Data of the signal Data. 2 may be written to a non-volatile memory element as described in Embodiment 2. For the details, Embodiment 2 can be referred to.

By the operation, the result of one measurement by the sensor circuit 440 can be written to the memory circuit. Needless to say, the sensor circuit 440 regularly records an output of a sensor element. The sensor circuit 440 regularly records the output of the sensor element by using power supplied from the contactless power feeding device 490; therefore, a change over time can be detected and recorded without contact with an object, a human body, or the like.

Note that the signal Data. 2 output from the sensor circuit 440, which is stored in the memory circuit 450, can be read by a command input through the contactless power feeding device 490. A signal Data. 3 which is read is transmitted by the control circuit 430 through the high frequency circuit 420, and is received by a reader portion included in the contactless power feeding device 490. Specifically, a reflected wave modulated by the read Data. 3 may be transmitted.

Modification Example

A method for driving an electronic device with the above structure is an embodiment of the present invention. The present invention also includes a method for driving an electronic device with a structure different from the above electronic device.

For example, sunlight energy supplied contactlessly or wirelessly can be converted into power by a photoelectric conversion element, and the power can be used. In this case, the power receiving element 410 can include a photoelectric conversion element and an antenna configured to output a reflected wave with high frequency.

Note that there is a problem in that power supplied from a solar cell becomes lower than a load to be connected, by the influence of the intensity of light from a light source, a relationship between direction of a light receiving surface and the light source, or the like.

According to the driving method illustrated in this embodiment, the power supply potential $V_{dd}$ in starting driving of any of loads which is the sensor circuit and the memory circuit is determined to be more than or equal to 90% of the initial potential $V_{dd0}$. Therefore, the load and an electronic device including the load can be operated stably.

Further, the power supply potential supplied to an intrinsic load can be stabilized at the power supply potential $V_{dd2}$ by the following driving method: a power supply circuit is connected to a dummy load, so that the power supply potential $V_{dd}$ is decreased from the initial potential $V_{dd0}$; after that, the power supply potential $V_{dd}$ reaches the power supply potential $V_{dd2}$ which is more than or equal to 90% and less than 100% of the initial potential $V_{dd0}$; and the power supply circuit is connected to an intrinsic load. Thus, the power supply potential $V_{dd}$ in starting driving of any load is determined to be more than or equal to 90% to less than 100% of the initial potential $V_{dd0}$. Therefore, the load and an electronic device including the load can be operated stably.

Further, the second period R2 is a period in which the power supply potential $V_{dd}$ is restored to more than or equal to 90% to less than 100% of the initial potential $V_{dd0}$, which is shorter than a period in which the power supply potential $V_{dd}$ is restored to 100% of the initial potential $V_{dd0}$. Thus, the load and an electronic device of the load can be operated stably, and an operation period the electronic device including the load connected to the power supply circuit can be short.

A passive electronic device including a sensor circuit and a non-volatile memory circuit as load circuits can be reduced in weight and size because a battery or the like is not needed. In the case where a mobile object is provided with such an electronic device, the electronic device does not become a burden. Further, in the case where such an electronic device is driven by a method illustrated in this embodiment, various changes in environment can be recorded. For example, the actions of an animal and the health condition of a patient can be recorded. In addition, a plurality of changes in environment can be recorded by providing a plurality of various sensors.

This embodiment can be freely combined with any of the other embodiments in this specification.

This application is based on Japanese Patent Application serial no. 2010-145130 filed with Japan Patent Office on Jun. 25, 2010, the entire contents of which are hereby incorporated by reference.

What is claimed is:

1. A driving method of an electronic device, wherein the electronic device comprises a power supply circuit to which power is fed from a contactless power feeding device, a control circuit to which power supply potential is supplied from the power supply circuit, and a load circuit, and wherein the power supply potential of the power supply circuit, when the power supply circuit is connected to no load element, is an initial potential, comprising the steps of:

supplying power to a first load element included in the load circuit by the power supply circuit in a first period;

stopping supplying power to a second load element by the power supply circuit in a second period, so that the power supply potential of the power supply circuit is restored to more than or equal to 90% and less than 100% of the initial potential; and supplying power to a third load element included in the load circuit by the power supply circuit in a third period, wherein the second period and the third period are alternately repeated n times wherein n is an integer equal to or larger than 0.

2. The driving method of the electronic device according to claim 1, wherein the third load element included in the load circuit comprises an one time programmable ROM.

3. The driving method of the electronic device according to claim 2, wherein data is written in a memory element of the ROM before the second period, further comprising the steps of:

verifying the data; and outputting a result of the verifying the data.

4. The driving method of the electronic device according to claim 2, wherein data is written in a memory element of the ROM before the second period, further comprising the steps of:

verifying the data; and outputting a result of the verifying the data, wherein when a writing error is detected by the verifying the data, a length of the third period is changed.

5. A driving method of an electronic device, wherein the electronic device comprises a power supply circuit to which power is fed from a contactless power feeding device, a control circuit to which power supply potential is supplied from the power supply circuit, and a load circuit, and wherein the power supply potential of the power supply circuit, when the power supply circuit is connected to no load element, is an initial potential comprising the steps of:

supplying power to a dummy load element included in the load circuit by the power supply circuit in a first period;

stopping supplying power to an intrinsic load element included in the load circuit by the power supply circuit in a second period, so that the power supply potential of the power supply circuit is restored to more than or equal to 90% and less than 100% of the initial potential; and supplying power to the intrinsic load element included in the load circuit by the power supply circuit in a third period, wherein the second period and the third period are alternately repeated n times wherein n is an integer equal to or larger than 0.

6. The driving method of the electronic device according to claim 5, wherein the intrinsic load element included in the load circuit comprises an one time programmable ROM.

7. The driving method of the electronic device according to claim 6, wherein data is written in a memory element of the ROM before the second period, further comprising the steps of:

verifying the data; and outputting a result of the verifying the data.

8. The driving method of the electronic device according to claim 6, wherein data is written in a memory element of the ROM before the second period, further comprising the steps of:

verifying the data; and outputting a result of the verifying the data, wherein when a writing error is detected by verifying the data, a length of the third period is changed.

9. A driving method of an electronic device, wherein the electronic device comprises a power supply circuit to which power is fed from a contactless power feeding device, and a load circuit, and wherein power supply potential of the power supply circuit connected to no load element is an initial potential, comprising the steps of:

supplying power to a first load element included in the load circuit by the power supply circuit in a first period;

stopping supplying power to the first load element by the power supply circuit in a second period, so that the power supply potential of the power supply circuit is restored to more than or equal to 90% and less than 100% of the initial potential; and supplying power to a second load element included in the load circuit by the power supply circuit in a third period.

10. The driving method of the electronic device according to claim 9, wherein the second load element included in the load circuit comprises an one time programmable ROM.

11. The driving method of the electronic device according to claim 10, wherein data is written in a memory element of the ROM before the second period, further comprising the steps of:

verifying the data; and outputting a result of the verifying the data.

12. The driving method of the electronic device according to claim 10, wherein data is written in a memory element of the ROM before the second period, further comprising the steps of:

verifying the data; and outputting a result of the verifying the data, wherein when a writing error is detected by the verifying the data, a length of the third period is changed.

* * * * *